US007881485B2

(12) United States Patent
Sporer et al.

(10) Patent No.: US 7,881,485 B2
(45) Date of Patent: Feb. 1, 2011

(54) APPARATUS AND METHOD OF DETERMINING AN IMPULSE RESPONSE AND APPARATUS AND METHOD OF PRESENTING AN AUDIO PIECE

(75) Inventors: Thomas Sporer, Fuerth (DE); Christian Neubauer, Nuremberg (DE)

(73) Assignee: Fraunhofer-Gesellschaft zur Foerderung der angewandten Forschung e. V., Munich (DE)

( * ) Notice: Subject to any disclaimer, the term of this patent is extended or adjusted under 35 U.S.C. 154(b) by 1309 days.

(21) Appl. No.: 11/129,708

(22) Filed: May 13, 2005

(65) Prior Publication Data

US 2005/0207592 A1 Sep. 22, 2005

Related U.S. Application Data

(63) Continuation of application No. PCT/EP03/12449, filed on Nov. 6, 2003.

(30) Foreign Application Priority Data

Nov. 21, 2002 (DE) ................................ 102 54 470

(51) Int. Cl.

*H04R 5/02* (2006.01)
*H04R 5/00* (2006.01)
*H04R 29/00* (2006.01)
*H03G 5/00* (2006.01)

(52) U.S. Cl. ........................... 381/303; 381/17; 381/98; 381/58; 381/56

(58) Field of Classification Search ................... 381/58, 381/59, 56, 57, 98, 102, 103, 94.2, 303, 310, 381/17, 18

See application file for complete search history.

(56) References Cited

U.S. PATENT DOCUMENTS 4,441,192 A 4/1984 Kita et al.

(Continued)

FOREIGN PATENT DOCUMENTS

DE 196 12 981 4/1996

(Continued)

OTHER PUBLICATIONS

Berkhout, A., et al. "Acoustic Control by Wave Field Synthesis" J. Acoust. Soc. Am. 93. May 1993.

(Continued)

*Primary Examiner*—Vivian Chin
*Assistant Examiner*—George Monikang
(74) *Attorney, Agent, or Firm*—Glenn Patent Group; Michael A. Glenn

(57) ABSTRACT

The apparatus for determining an impulse response in an environment in which a speaker and a microphone are placed works using an audio signal. Means for spectrally coloring a test signal, which preferably is a pseudonoise signal, works using a psychoacoustic masking threshold of the audio signal to obtain a colored test signal, which is embedded in the audio signal to obtain a measuring signal, which can be fed to the speaker. Means for determining the impulse response preferably performs a cross-correlation of a reaction signal received via the microphone from the environment and the test signal or the colored test signal. With this, an impulse response of an environment may also be determined during the presentation of an audio piece to provide an optimal description of environment for a wave-field synthesis.

21 Claims, 4 Drawing Sheets

U.S. PATENT DOCUMENTS

| | | | | |
|---|---|---|---|---|
| 4,536,887 | A * | 8/1985 | Kaneda et al. | 381/92 |
| 5,502,747 | A | 3/1996 | McGrath | |
| 6,386,039 | B1 * | 5/2002 | Peters | 73/589 |
| 6,639,989 | B1 * | 10/2003 | Zacharov et al. | 381/303 |
| 6,760,451 | B1 * | 7/2004 | Craven et al. | 381/98 |
| 7,158,643 | B2 * | 1/2007 | Lavoie et al. | 381/58 |

FOREIGN PATENT DOCUMENTS

| | | |
|---|---|---|
| DE | 197 32 005 | 7/1997 |
| DE | 100 27 618 | 6/2000 |
| EP | 0 875 107 | 1/1997 |
| EP | 0 989 776 | 3/2000 |
| JP | 2001025085 | 1/2001 |
| JP | 2002330500 A | 11/2002 |
| JP | 2004171497 A | 6/2004 |

OTHER PUBLICATIONS

De Vries, D., et al. "Wave Field Synthesis and Analysis Using Array Technology" Proc. 1999 IEEE Workshop on Application of Signal Processing to Audio and Acoustics. New Paltz, New York. Oct. 17-20, 1999.

Pellegrini, R., et al. "Perceptual Encoding of Acoustic Environments" Multimedia and Expo, 2002. ICME 2002. Proceedings. 2002. IEEE International Conference on Multimedia and Expo.

Horbach, U. et al. "Real-time Rendering of Dynamic Scenes Using Wave Field Synthesis" Multimedia and Expo 2002. ICME 2002. Proceedings 2002. IEEE International Conference on Multimedia and Expo.

* cited by examiner

ALSO CHANNELS: K12, K13, K21, K23, K31, K32

$$H(t)=\begin{bmatrix} h_0 & h_1 & 0 \\ 0 & h_0 & h_1 \\ 0 & 0 & h_0 \end{bmatrix} \quad ; \quad p(t)=\begin{bmatrix} p_0 \\ p_1 \\ p_2 \end{bmatrix} \; ;$$

$$y=H\cdot p=p(t)*h(t)$$

CROSS-CORRELATION: $$E\{\overbrace{H\cdot p}^{y(t)}\cdot p^{*T}\}=$$

$$=\lim_{N\to\infty}\frac{1}{N}\sum_{i=0}^{N}(H\cdot p_i)\cdot p_i^{*T}=$$

$$=\sigma_p^2\cdot H\cdot\left[E(Q\cdot Q^H)\right]$$

Q: COLORING FILTER

APPARATUS AND METHOD OF DETERMINING AN IMPULSE RESPONSE AND APPARATUS AND METHOD OF PRESENTING AN AUDIO PIECE

CROSS-REFERENCE TO RELATED APPLICATION

This application is a continuation of co-pending International Application No. PCT/EP03/12449, filed Nov. 6, 2003, which designated the United States and was not published in English and is incorporated herein by reference in its entirety.

BACKGROUND OF THE INVENTION

1. Field of the Invention

The present invention relates to determining an impulse response as well as to presenting an audio piece in an environment of which an impulse response has been determined.

2. Description of the Related Art

There is an increasing need for new technologies and innovative products in the area of entertainment electronics. It is an important prerequisite for the success of new multimedia systems to offer optimal functionalities or capabilities. This is achieved by the employment of digital technologies and, in particular, computer technology. Examples for this are the applications offering an enhanced close-to-reality audiovisual impression. In previous audio systems, a substantial disadvantage lies in the quality of the spatial sound reproduction of natural, but also of virtual environments.

Methods of multi-channel speaker reproduction of audio signals have been known and standardized for many years. All usual techniques have the disadvantage that both the site of the speakers and the position of the listener are already impressed on the transfer format. With wrong arrangement of the speakers with reference to the listener, the audio quality suffers significantly. Optimal sound is only possible in a small area of the reproduction space, the so-called sweet spot.

A better natural spatial impression as well as greater enclosure or envelope in the audio reproduction may be achieved with the aid of a new technology. The principles of this technology, the so-called wave-field synthesis (WFS), have been studied at the TU Delft and first presented in the late 80s (Berkout, A. J.; de Vries, D.; Vogel, P.: Acoustic control by Wave-field Synthesis. JASA 93, 993).

Due to this method's enormous requirements for computer power and transfer rates, the wave-field synthesis has up to now only rarely been employed in practice. Only the progress in the area of the microprocessor technology and the audio encoding do permit the employment of this technology in concrete applications today. First products in the professional area are expected next year. In a few years, first wave-field synthesis applications for the consumer area are also supposed to come on the market.

The basic idea of WFS is based on the application of Huygens' principle of the wave theory:

Each point caught by a wave is starting point of an elementary wave propagating in spherical or circular manner.

Applied on acoustics, every arbitrary shape of an incoming wave front may be replicated by a large amount of speakers arranged next to each other (a so called speaker array). In the simplest case, a single point source to be reproduced and a linear arrangement of the speakers, the audio signals of each speaker have to be fed with a time delay and amplitude scaling so that the radiating sound fields of the individual speakers overlay correctly. With several sound sources, for each source the contribution to each speaker is calculated separately and the resulting signals are added. If the sources to be reproduced are in a room with reflecting walls, reflections also have to be reproduced via the speaker array as additional sources. Thus, the expenditure in the calculation strongly depends on the number of sound sources, the reflection properties of the recording room, and the number of speakers.

In particular, the advantage of this technique is that a natural spatial sound impression across a great area of the reproduction space is possible. In contrast to the known techniques, direction and distance of sound sources are reproduced in a very exact manner. To a limited degree, virtual sound sources may even be positioned between the real speaker array and the listener.

Although the wave-field synthesis functions well for environments whose properties are known, irregularities occur if the property changes or the wave-field synthesis is executed on the basis of an environment property not matching the actual property of the environment.

An environment property may be described by the impulse response of the environment.

This is set forth in greater detail on the basis of the subsequent example. It is being started from the fact that a speaker sends out a sound signal against a wall the reflection of which is undesired. For this simple example, the space compensation using the wave-field synthesis would be to at first determine the reflection of this wall in order to determine when a sound signal having been reflected from the wall arrives again at the speaker, and which amplitude this reflected sound signal has. If the reflection from this wall is undesirable, there is the possibility with the wave-field synthesis to eliminate the reflection from this wall by impressing a signal of opposite phase regarding the reflection signal with corresponding amplitude in addition to the original audio signal on the speaker, so that the outbound compensation wave extinguishes the reflection wave, such that the reflection from this wall is eliminated in the environment being considered. This may take place by at first calculating the impulse response of the environment and determining the property and position of the wall on the basis of the impulse response of this environment, with the wall being interpreted as mirror source, i.e. as sound source, reflecting incident sound.

If at first the impulse response of this environment is measured and then the compensation signal which has to be impressed on the speaker superimposed on the audio signal is calculated, cancellation of the reflection from this wall will take place, such that a listener in this environment sonically has the impression that this wall does not exist at all.

It is, however, critical for optimum compensation of the reflected wave that the impulse response of the room is determined accurately so that no over- or undercompensation occurs.

In a presentation room there is a problem in that it is almost impossible to measure the real impulse response of an environment, since in a presentation room, such as a movie theater, a concert hall, or also the living room at home, constant changes of the environment take place. In other words, in a movie theater presentation room it cannot be predicted how many people come to a certain presentation. If for the wave field synthesis an impulse response optimally calculated for an empty presentation room was employed, wherein in the calculation of the impulse response no people were in the room, overcompensation of the reflected sound wave would take place due to the attenuation of people present at the presentation, in that two disadvantages arise. On the one hand, the reflection at the wall is no longer optimally compensated for. On the other hand, due to the overcompensation, since the attenuation of the reflected wave by the impulse response underlying the wave-field synthesis is no longer sensed optimally, an additional audible spurious signal detracting from the overall audio impression will occur.

Optimum application of the wave-field synthesis depends on the environment in which it is being presented always being optimally sensed in order to achieve desired aims, such as special acoustics, or not to introduce audible interferences.

One possibility would be to fit a concert hall, for example, with dummy audience the reflection properties of which correspond to those of living audience. Then, a corresponding impulse response could be determined, which corresponds to the real situation at least better than when using the impulse response of the empty concert hall, i.e. without any audience, for wave-field synthesis.

This procedure is disadvantageous in that in a public presentation, just like e.g. in the living room at home, it cannot be predicted how many audience come to the presentation. An optimum sound impression is then only achieved when the number of dummy audience and the positioning of the dummy audience almost correspond to the actual number and positioning of the living audience. Moreover, the expenditure for fitting a major movie theater or concert hall with a lot of dummy audience is considerable.

Alternatives to the determination of a real impulse response are to measure the impulse response of the room shortly before the beginning of the presentation, i.e. when the presentation room is already filled with the audience actually going to be present at the presentation, in order to have a realistic description of environment, which will only strongly deviate from the actual situation if for example after a break a lot of audience would no longer be present at the presentation, etc.

This procedure, however, is problematic from two aspects. On the one hand, the calculation of the impulse response of a room takes a certain time. On the other hand, the determination has to take place immediately prior to the beginning of the presentation so that, if possible, all audience already are in the presentation room. Since it is exactly the presence of the audience that is critical, it is not avoidable in this procedure that the audience all have to wait until the measurement is completed, so that in this procedure the actual beginning of the presentation would always be postponed. When becoming known among the audience, this procedure would lead to the fact that most of the audience would only come later than at the actual beginning of the presentation, so that the actual aim, i.e. to sense an impulse response of an environment in realistic surroundings, again cannot be achieved.

Moreover, it is problematic that, for impulse response determination in a presentation room, acoustic signals have to be fed into the room, and that these acoustic signals should have considerable energy in particular in larger presentation rooms, in order to achieve secure impulse response determination. Experiments with acoustic chirps prior to the beginning of the presentation for the determination of the impulse response, i.e. as measuring signals sent out via speakers, have shown that this method is not particularly feasible. On the one hand, many listeners found the acoustic chirps sent out with considerable volume annoying. Other audience began to imitate the chirps from the speaker themselves so that measurement of the reaction signal to the acoustic chirps was problematic to impossible, since it could not be discriminated whether the chirps come from the speaker or whether it was chirps imitated by people.

Alternative procedures for the determination of the impulse response of a room are to use a pseudonoise sequence with a white spectrum as measuring signal. Although the noise cannot immediately be imitated by the audience, it is still annoying for many people and, when this method would be applied again and again, lead to the fact that the people would no longer come to the beginning of the presentation as indicated, but only a certain amount of time later, when they can safely assume that the impulse response determination of the presentation room perceived as annoying is already completed.

SUMMARY OF THE INVENTION

It is the object of the present invention to provide a concept for determining an impulse response as well as a concept for presenting an audio piece using an ascertained impulse response to achieve an accurate impulse response and thus a presentation with high audio quality.

In accordance with a first aspect, the present invention provides an apparatus for determining an impulse response in an environment in which a speaker and a microphone are placed, using an audio signal, having a processor for spectrally coloring a test signal using a psychoacoustic masking threshold of the audio signal; an introducer for introducing the colored test signal into the audio signal to obtain a measuring signal, which may be fed to the speaker; and a calculator for calculating the impulse response using a reaction signal received via the microphone from the environment and the test signal or the colored test signal.

In accordance with a second aspect, the present invention provides an apparatus for presenting an audio piece in an environment in which several speakers and several microphones are placed, having a performer for performing a wave-field synthesis to calculate audio signals for the plurality of speakers on the basis of the audio piece; and a determinator for determining the impulse response in the environment in which a speaker and a microphone are placed, using an audio signal, having a processor for spectrally coloring a test signal using a psychoacoustic masking threshold of the audio signal; an introducer for introducing the colored test signal into the audio signal to obtain a measuring signal, which may be fed to the speaker; and a calculator for calculating the impulse response using a reaction signal received via the microphone from the environment and the test signal or the colored test signal, wherein the determinator is formed to calculate a current impulse response during presenting the audio piece, wherein the performer for performing the wave-field synthesis is controllable to take a current impulse response into account in a calculation of the audio signal for the plurality of speakers during the presentation of the audio piece.

In accordance with a third aspect, the present invention provides a method of determining an impulse response in an environment in which a speaker and a microphone are placed, using an audio signal, with the steps of spectrally coloring a test signal using a psychoacoustic masking threshold of the audio signal; introducing the colored test signal into the audio signal to obtain a measuring signal, which can be fed to the speaker; and calculating the impulse response using a reaction signal received via the microphone from the environment and the test signal or the colored test signal.

In accordance with a fourth aspect, the present invention provides a method of presenting an audio piece in an environment in which several speakers and several microphones are placed, with the steps of performing a wave-field synthesis to calculate audio signals for the plurality of speakers on the basis of the audio piece; and determining the impulse response in the environment in which a speaker and a microphone are placed, using an audio signal, having a processor for spectrally coloring a test signal using a psychoacoustic masking threshold of the audio signal; an introducer for introducing the colored test signal into the audio signal to obtain a measuring signal, which may be fed to the speaker; and a calculator for calculating the impulse response using a reaction signal received via the microphone from the environment and the test signal or the colored test signal, wherein the determinator is formed to calculate a current impulse response while presenting the audio piece, wherein the performer for performing the wave-field synthesis is controllable to take a current impulse response into account in a calculation of the audio signals for the plurality of speakers during the presentation of the audio piece.

In accordance with a fifth aspect, the present invention provides a computer program with a program code for performing, when the program is executed on a computer, the method of determining an impulse response in an environment in which a speaker and a microphone are placed, using an audio signal, with the steps of spectrally coloring a test signal using a psychoacoustic masking threshold of the audio signal; introducing the colored test signal into the audio signal to obtain a measuring signal, which can be fed to the speaker; and calculating the impulse response using a reaction signal received via the microphone from the environment and the test signal or the colored test signal.

In accordance with a sixth aspect, the present invention provides a computer program with a program code for performing, when the program is executed on a computer, the method of presenting an audio piece in an environment in which several speakers and several microphones are placed, with the steps of performing a wave-field synthesis to calculate audio signals for the plurality of speakers on the basis of the audio piece; and determining the impulse response in the environment in which a speaker and a microphone are placed, using an audio signal, having a processor for spectrally coloring a test signal using a psychoacoustic masking threshold of the audio signal; an introducer for introducing the colored test signal into the audio signal to obtain a measuring signal, which may be fed to the speaker; and a calculator for calculating the impulse response using a reaction signal received via the microphone from the environment and the test signal or the colored test signal, wherein the determinator is formed to calculate a current impulse response while presenting the audio piece, wherein the performer for performing the wave-field synthesis is controllable to take a current impulse response into account in a calculation of the audio signals for the plurality of speakers during the presentation of the audio piece.

The present invention is based on the finding that accurate impulse response determination may be achieved by introducing a test signal for determining the impulse response into an audio signal, so that it is inaudible or almost inaudible and cannot become an annoyance for a listener. The listener still hears the audio signal and is not adversely affected by the impulse response determination. Thus, they will not look for ways to be outside the environment considered during the determination of the impulse response. Since no visitor tries to evade the impulse response determination in the presentation room, an accurate impulse response is achieved, because a realistic determination of the impulse response without annoyance for the listener may take place.

According to the invention, the test signal to be introduced in the audio signal is spectrally colored prior to introduction into the audio signal using a psychoacoustic masking threshold of the audio signal, in order to obtain a colored test signal. The colored test signal is then introduced into the audio signal by being added up spectrally or in the time domain to obtain a measuring signal. A reaction signal received as reaction to the measuring signal is then, together with the test signal, fed to a cross-correlation in order to ascertain the impulse response of a transmission channel between a speaker on the one hand and a microphone on the other hand on the basis of this cross-correlation in a corresponding environment.

The inventive hiding of the test signal in the audio signal leads to the fact that the visitor does not even notice that an impulse response is just being determined. The lack of acceptability described of such measurements according to the prior art is no longer present in the inventive subject matter, which again leads to the fact that all audience are present in the impulse response determination, so that an accurate impulse response of the environment is obtained.

In a preferred embodiment, the test signal is a pseudonoise signal having a white spectrum, and which may thus be employed particularly well for the impulse response determination. Moreover, the spectral coloring using the psychoacoustic masking threshold of the audio signal can be performed easily and quickly.

The use of various, mutually orthogonal pseudonoise sequences leads to the fact that at the same time several individual impulse responses may be determined in an environment in which there are several speakers and one or more microphones.

Alternatively, several individual impulse responses may also be determined sequentially.

In a preferred embodiment of the present invention, a current impulse response of the environment may be determined also during the presentation of the audio piece. This feature is particularly useful to determine and track the impulse response of the environment constantly during the presentation of an audio piece, so that always optimum sound is obtained, independent of whether the environment changes or not.

This is all made possible by the fact that the listener does not notice any of it or only notices very little, since the test signal has been spectrally colored for the determination of the impulse response using the psychoacoustic masking threshold of the audio signal, so that the test signal has been either completely hidden under the masking threshold or is introduced by a predetermined amount above the masking threshold, which may vary temporally or spectrally, so that the visitor in some cases perhaps perceives an interference, but with this interference being clearly smaller than in known procedures.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
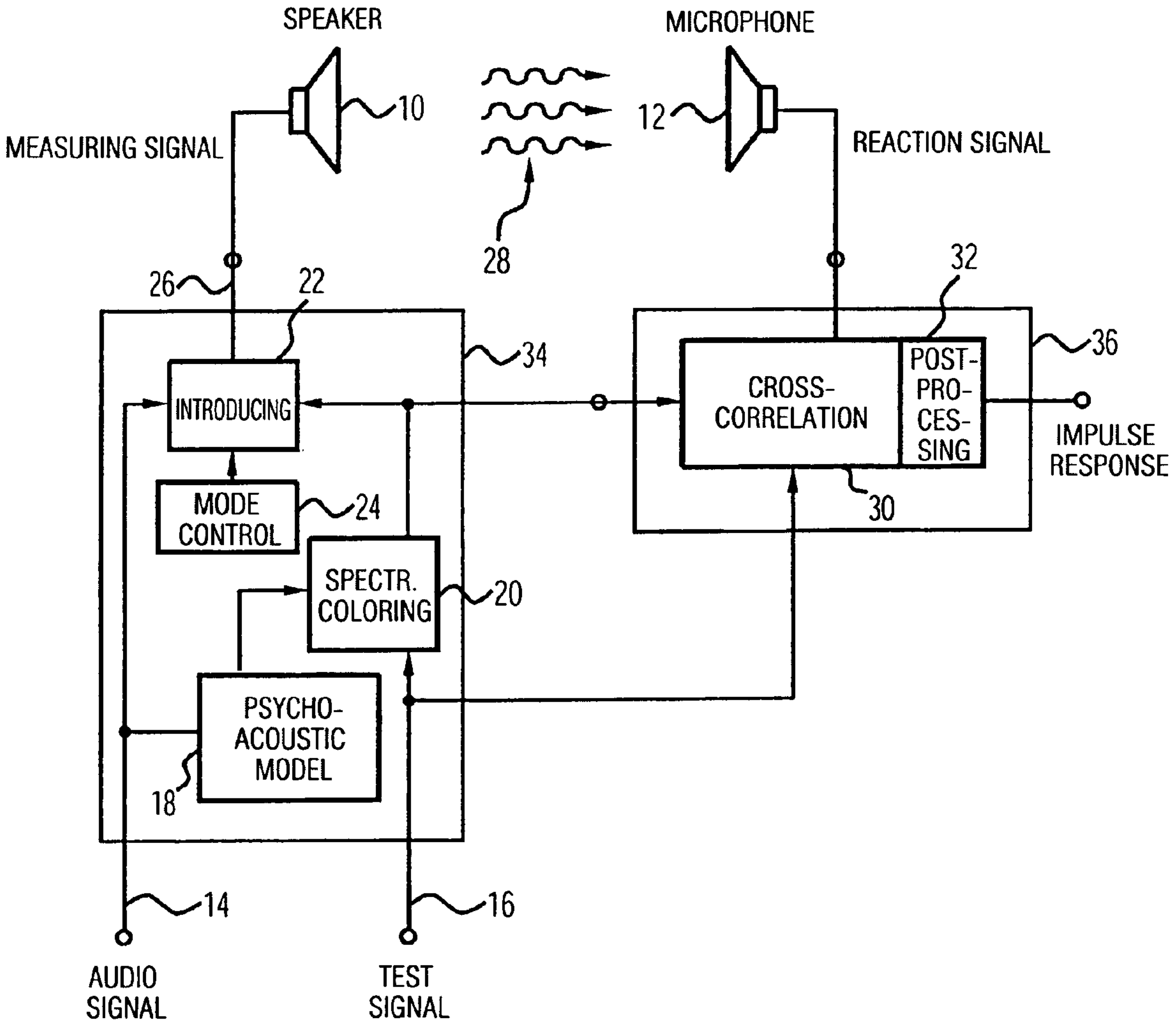
FIG. 1 is a block circuit diagram of the inventive concept for determining an impulse response.

FIG. 1 shows a block circuit diagram of an apparatus for determining an impulse response in an environment in which a speaker 10 and a microphone 12 are placed. For the impulse response determination, an audio signal is employed, which is fed into an audio signal input 14. Moreover, a test signal is used, which is fed into a test signal input 16. For the ascertainment of the psychoacoustic masking threshold of the audio signal 14 any known psychoacoustic model 18 is employed. Using a psychoacoustic masking threshold calculated from the psychoacoustic model 18, spectral coloring 20 of the test signal fed at the input 16 is achieved. At the output of means 20 for spectrally coloring, thus, a spectrally colored test signal is present, which is fed to means 22 for introducing the spectrally colored test signal into the audio signal 14.

For subsequently explained functionalities, also a mode control means 24 is provided to control means 22 for introducing in order to perform various measuring modes. At an output of means 22 for introducing, which is designated as 26 in FIG. 1, a measuring signal fed to the speaker 10 is present. The individual possibilities for introducing a signal into an audio signal are disclosed in European patent EP 0 875 107 B1. Thus, the introducing of the spectrally colored test signal into the audio signal may either take place in the time domain by sample-wise adding. In this case, the spectrally colored test signal, just like the audio signal, has to be present in the time domain in order to perform the sample-wise addition.

Alternatively, a certain temporal portion of the audio signal or of the test signal may be transformed to the frequency domain in order to then perform spectral value-wise addition between the transformed audio signal and the transformed test signal. The measuring signal thus arising in the frequency domain then has to be transformed to the time domain again to be fed to a speaker as measuring signal. The corresponding details of optional pre- and postprocessings regarding digital/analog conversion before the speaker 10 are not illustrated in FIG. 1, since they are known to those skilled in the art.

The measuring signal fed to the speaker 10 is converted to a sound signal 28 received by the microphone 12 and designated as reaction signal by the speaker. The reaction signal is fed to a cross-correlation means 30 performing a cross-correlation between the reaction signal and the spectrally colored test signal or alternatively the immediately present test signal prior to the spectral coloring. Depending on which signals are used or depending on test signal and spectral coloring, after the cross-correlation postprocessings may still come up, which are caused by a postprocessing means 32 to obtain the impulse response of the channel between the speaker 10 and the microphone 12.

In a preferred embodiment of the present invention, a pseudonoise signal having a white spectrum is employed as test signal. In this case it is possible to concurrently determine various impulse responses by providing various speakers with measuring signals each based on different mutually substantially orthogonal pseudonoise sequences. Moreover, the use of a pseudonoise signal is favorable, because it may be generated easily and quickly in arbitrary location, when for example a unit with feedback shift register is employed, which generates a repeatable pseudonoise sequence depending on a certain starting value also referred to as seed in the art. When such shift registers are made available at each speaker and at each microphone, the test signal does not have to be transmitted from a unit 34 associated with a speaker to a unit 36 associated with a microphone, but may be generated decentrally in arbitrary location. Alternatively, there is the possibility to implement units 34, 36 as a single unit. In this case, the measuring signal for the speaker 10 and the reaction signal from the microphone 12 would be transmitted to the central unit formed of units 34 and 36 via cable connections, such as glass fiber cables, or wireless connections.

The present invention is particularly well employable in multi speaker systems using a large number of speakers to reproduce the natural acoustics of the recording room or artificial acoustics having been designed by the sound engineer. For this, a wave-field synthesis module is used as module, as it has been illustrated at the beginning. Synthesized acoustics or the natural acoustics of the recording room may then be reproduced well, when the acoustics of the reproduction room do not have too great an influence, by “compensating out” these acoustics. For this, the wave-field synthesis is used for example to reduce strong reflections of the actual reproduction room by applying inverse filtering with the inventively determined room impulse response. Since the room impulse response is influenced by the number of people in the room and/or the movement of objects, like furniture, curtains, etc., the inventive procedure for the determination of the impulse response is particularly advantageous, because in a way it may always be performed, i.e. during music played before an actual presentation or even during the actual presentation, because the test signal is “hidden” in the audio piece pleasant for the listener.

Preferably, thus a pseudonoise signal is embedded in an audio signal for a speaker, which is spectrally colored according to the masking threshold of the audio signal reproduced by one or each of the speakers.

The measurement of the impulse response may be performed either for all speakers at the same time using different PNS sequences for each speaker or sequentially in a so-called round robin approach. While the first version has better temporal behavior, the second version yields better signal/noise ratio, i.e. a more accurate impulse response.

For both measurements applies that they are not or only barely perceptible by a listener, depending on how hard the spectral coloring is guided at the psychoacoustic masking threshold. For measurements e.g. during the reproduction of the audio piece itself, because of which the listeners came, it is preferred to ensure that the spectral coloring is performed such that the test signal always remains below the psychoacoustic masking threshold. For play-in music for example prior to the actual presentation or for commercials taking place before a movie, it is, however, also possible to provide the test signal with more energy regarding the audio signal, because here slight interferences are not necessarily perceived as particularly negative by the listener. In this case, potentially more quickly converging or more accurate impulse response measurements are achievable, because the test signal is emitted with more energy on average, which makes itself felt in a better signal/noise ratio.

Figure 2:
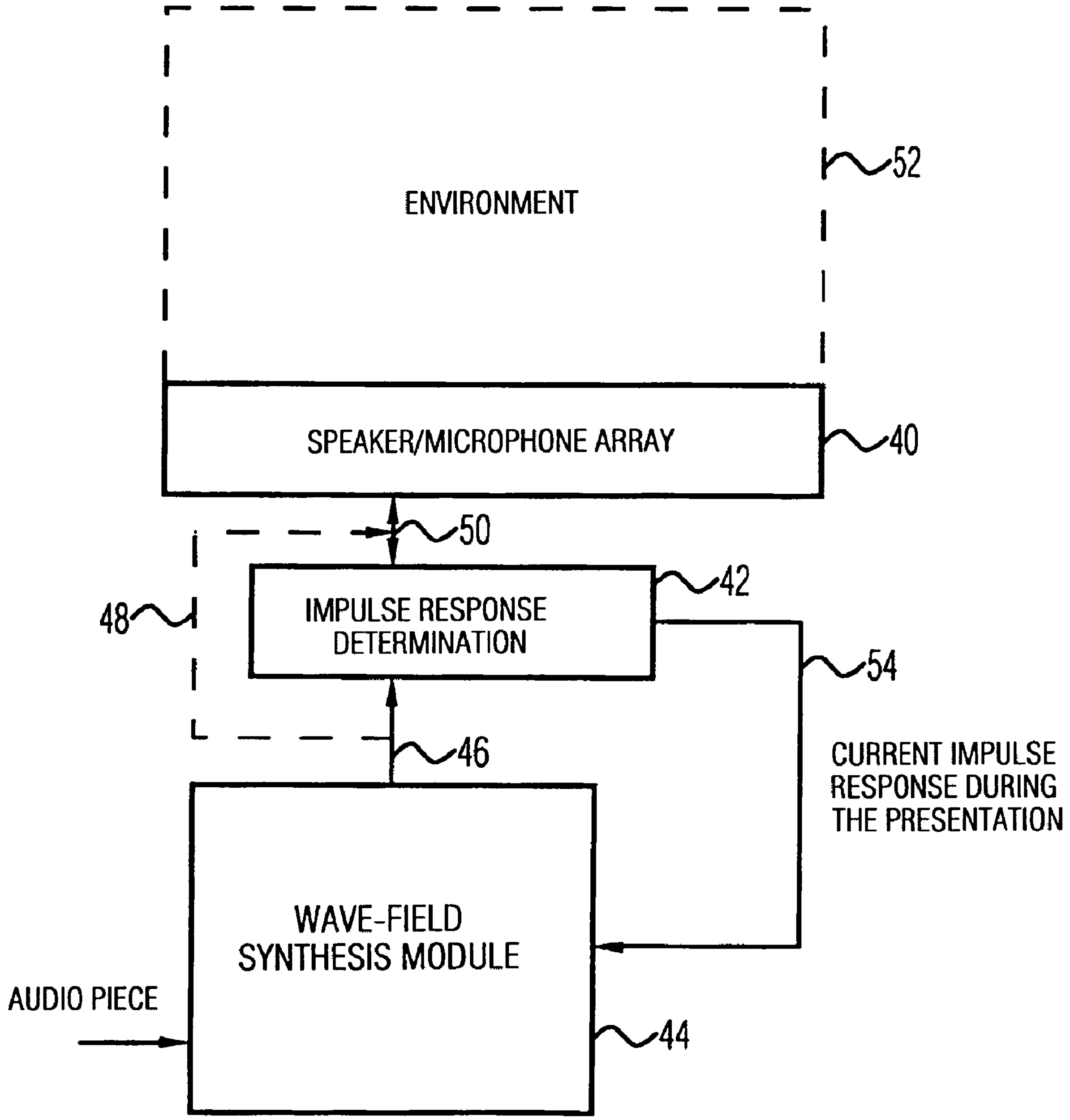
FIG. 2 is a block circuit diagram of the inventive concept for presenting an audio piece.

In the following, on the basis of FIG. 2, an inventive apparatus for presenting an audio piece in an environment in which a plurality of speakers and several microphones are placed is illustrated. For this, a speaker/microphone array 40 is outlined in FIG. 2. Upstream of the speaker/microphone array 40, there is the impulse response determination apparatus 42 illustrated in FIG. 1, which is coupled to a wave-field synthesis module 44. For the impulse response determination, the wave-field synthesis module calculates audio signals for the speakers in the speaker array 40 on the basis of an audio piece fed and on the basis of default settings for the acoustics of the environment. These signals are output via an output 46 of the wave-field synthesis module and either directly fed to the speaker/microphone array 40, as illustrated by a dashed path 48, or when an impulse response determination is to be performed fed to the impulse response determination means 42 receiving the audio signals via the line 46 on the input side and giving off the measuring signals to the speaker array 40 via a line 50 on the output side.

The reaction signals are caught by the microphone array and again fed to the impulse response determination means 42 via the line 50, which is a two-way line, so that it may perform a cross-correlation processing preferred for the invention and a potentially necessary postprocessing. Default settings in the wave-field synthesis module for the acoustics of the environment 52 may then be updated by a current impulse response, which has been computed by means 42 e.g. during the presentation of the audio piece, so that the acoustics settings used by the wave-field synthesis module may be constantly updated via the environment and better adapted to the actual environment 52. This functionality is illustrated by a feedback path 54 in FIG. 2.

Thus, the wave-field synthesis module 44 may be started with default settings for the impulse response and updated using the current measurements of the impulse response determination means 42. The default settings including the position of the speakers may be measured by the inventive impulse response determination means 42 outside the presentation by either employing psychoacoustically colored PNS sequences together with the music or by using no music but the pure PNS sequence.

At this point it is to be noted that it is known in the art to for example interpolate the overall multidimensional impulse response of this environment from many various impulse responses in an environment. Moreover, it is known in the art to associate sound output sources with certain positions in the three-dimensional room on the basis of an impulse response found in such a manner. Here, a difference is also made between usual sound sources, such as speakers, and so-called mirror sound sources, such as reflecting walls. The inventive impulse response determination thus enables to obtain a description of environment without annoyance for those listening, without having to ascertain positions of the microphones manually, for example by means of distance measurements.

Regarding the placement of the microphones for the impulse response determination, there are various possibilities. Regarding the impulse response to be determined, it is best to place the microphones in the environment 42 remotely from the speakers. In a presentation room with people, however, this is often impracticable. Hence, in this case, it is preferred to place the microphones between the speakers so that they are not "in the way".

While the placement of the microphones remotely from the speakers is being preferred to perform impulse response measurements from which a default setting for the wave-field synthesis module 44 is computed, it is preferred to place the microphones between the speakers when an adaptation of the wave-field synthesis module 44 is to be performed during the presentation.

The microphones may be arranged fixedly or movably in circular, linear, or cross-shaped configuration. With reference to the microphone movement, they may be moved in a circle or using an x/y displacement device in the room during the measurement. Such procedures are less practicable in an impulse response adaptation during the presentation so that here stationary microphones preferably between the speakers are preferred.

For rather more inexpensive applications, in particular in the consumer area, the microphones may be replaced by speakers to reduce the number of components. Each speaker works due to the fact that it has a membrane and a vibrating coil equally as microphone when it is read out correspondingly. To this end, it is preferred to use one or more speakers of the speaker array, which is present for the reproduction anyway, as microphones in an impulse response determination mode for corresponding consumer applications, to determine the impulse response before the presentation of an audio piece in order to then, when playing the audio piece, again use all speakers as speakers. For adaptation during the presentation, arbitrarily selected speakers could be employed as microphones from time to time to perform adaptation without having to employ extra microphones. When a large number of speakers are being used, the temporary switching of some few speakers will be unproblematic regarding the audio impression.

Figure 3:
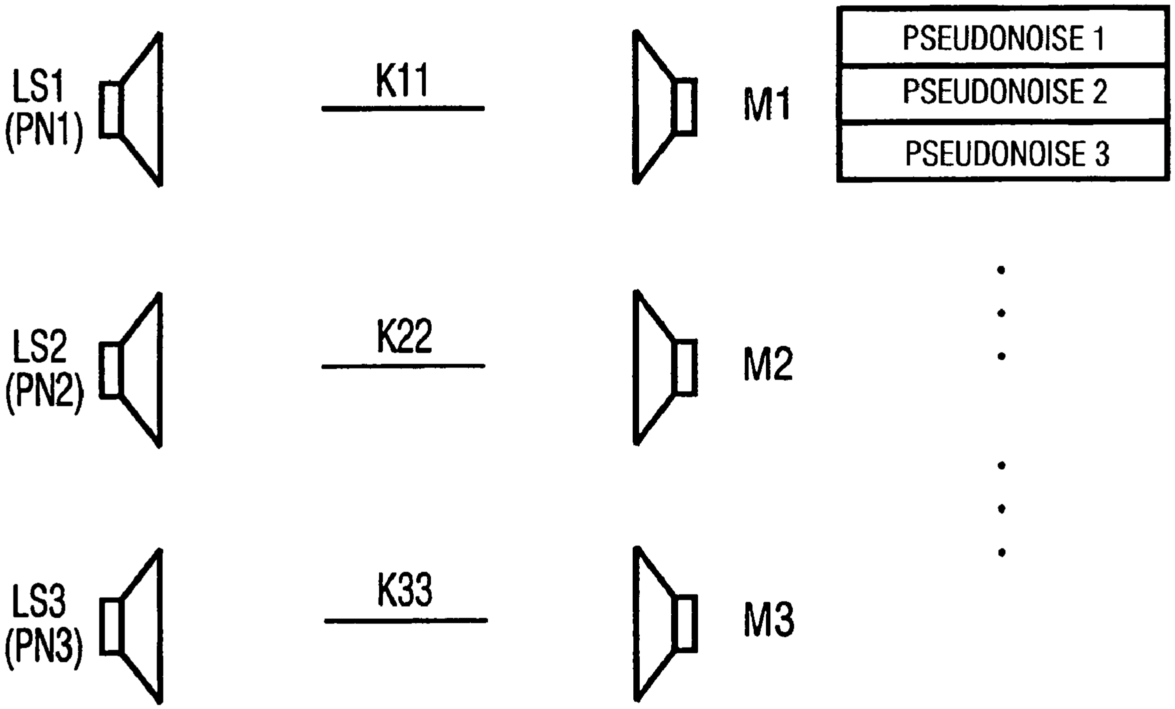
FIG. 3 is a schematic illustration of an environment with several speakers and several microphones.

FIG. 3 shows a real situation in which many speakers and many microphones are used. An impulse response may be indicated for the channel from each speaker to each microphone. The channel between the speaker 1 (LS1) to the microphone 1 (M1) is designated as K11. By analogy herewith, the channel from the first speaker (LS1) to the third microphone (M3) is designated as K31, etc. If all speakers LS1, LS2, LS3 send concurrently, the reaction signal received from the microphone M1 may be used to calculate three various impulse responses. The basis for this is that a first pseudonoise sequence PN1 is impressed on the first speaker (LS1) in the context of the measuring signal for the first speaker. Correspondingly, the second speaker (LS2) obtains a second pseudonoise sequence (PN2). Moreover, the third speaker (LS3) obtains a third pseudonoise sequence (PN3). The channel K11 between the first speaker LS1 and the first microphone M1 is calculated by performing a cross-correlation of the reaction signal received by the first microphone M1 with the pseudonoise sequence 1. The channel K21 from the second speaker to the first microphone is calculated by correlation with the pseudonoise sequence 2. The channel K31 from the third speaker LS3 to the first microphone M1 is obtained by correlation with the pseudonoise sequence 3. When all three speakers and all three microphones are operated at the same time, thus all nine impulse responses may be calculated. This measuring mode provides better temporal behavior, because the resulting multidimensional impulse response of the sional impulse response of the environment, which is determined from the ascertained nine individual impulse responses by interpolation, is determined on the basis of concurrently sent measuring signals.

Alternatively, a better signal/noise ratio and thus a more accurate impulse response may be obtained, when at first the speaker 1 is operated and at the same time all three microphones calculate the three channels K11, K12 and K13 by correlation of the received signal with the pseudonoise sequence 1. Then, at a subsequent time instant, the same is performed for the speaker 2, and finally the same is performed for the speaker 3. With this, the various impulse responses are ascertained after another, wherein always as many impulse responses are ascertained at the same time as there are microphones.

Subsequently, it is summarized how the impulse response h(t) of a channel is determined by cross-correlation. For this, a time-discrete test signal p(t) is applied on the channel. The channel outputs a reception signal y(t) on the output side, which, as it is known, corresponds to the convolution of the input signal and with the channel impulse response. For the subsequent explanation of a procedure for the determination of the cross-correlation on the basis of FIG. 5, it is proceeded to a matrix notation. Exemplarily a channel impulse response with only two values $h_0$ and $h_1$ is assumed without limitation of the generality. The channel impulse response $h_0$, $h_1$ may be written as channel impulse response matrix H(t) having the band structure shown in FIG. 5, wherein the rest of the elements of the matrix are filled up with zeros. Moreover, the excitation signal p(t) is written as vector, wherein here it is assumed that the excitation signal has only three samples $p_0$, $p_1$, $p_2$ without limitation of the generality.

Figures 4, 5:
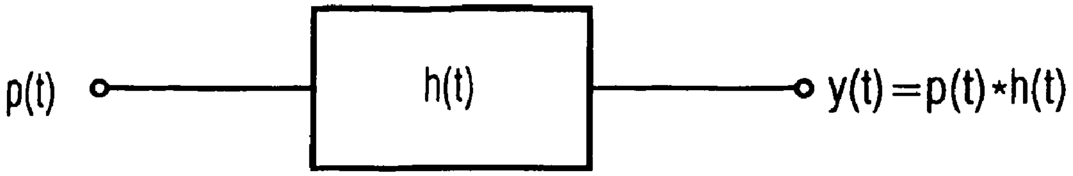
FIG. 4 is a general illustration of a transmission channel written to by an impulse response.
FIG. 5 is a short deduction of the determination of the impulse response by cross-correlation with colored or spectrally flat test signal.

It can be shown that the convolution illustrated in FIG. 4 corresponds to the matrix vector multiplication illustrated in FIG. 5, so that a vector y for the output signal results. The cross-correlation may be written as expectation value E { . . . } of the multiplication of the output signal y(t) by the conjugated complex transposed excitation signal $p^{*T}$. The expectation value is calculated as limit for N to infinite via the summation of individual products for various excitation signals $p_i$ illustrated in FIG. 5. The multiplication and ensuing summation yields the cross-correlation matrix illustrated top left in FIG. 5, wherein it is weighted with the effective value of the excitation signal p, which is illustrated with $\sigma_p^2$. For immediately obtaining the channel impulse response h(t), for example, the first row of the channel impulse response matrix is taken, whereupon the individual components are divided by $\sigma_p^2$ in order to immediately obtain the individual components of the channel impulse response $h_0$, $h_1$.

If instead of a white excitation signal p(t) a spectrally colored excitation signal is used, the spectral coloring may be represented by digital filtering, wherein the filter is described by a filter coefficient matrix Q. In the equation illustrated in FIG. 5 in the last row, the correlation matrix H also results on the output side, but now also weighted with the expectation value via $Q \times Q^H$. By division of the individual impulse response coefficients $h_0$, $h_1$ by the expectation value via $Q \times Q^H$, i.e. by taking the coloring filter into account, in the postprocessing means 32 of FIG. 1, for example, the channel impulse response may be determined immediately regarding its individual components.

It is to be pointed out that the cross-correlation concept for calculating the impulse response is an iterative concept, as it is apparent from the summation approach for the expectation value illustrated in FIG. 5. The first multiplication of the reaction signal by the conjugated complex transposed excitation signal already yields a first, still very rough estimate for the channel impulse response, which becomes better and better with each further multiplication and summation. If the entire matrix H(t) is calculated by the iterative summation approach, it turns out that the elements of the band matrix H(t) set to zero top left in FIG. 5 gradually approach zero, whereas in the center, i.e. the band of the matrix, the coefficients of the channel impulse response h(t) remain and take on certain values. It is again to be pointed out that it is not necessary to calculate the entire matrix. It is sufficient to only calculate e.g. one row of the matrix H(t) to obtain the entire channel impulse response.

At this point it is to be pointed out that the inventive concept is not limited to the procedure for calculation of the cross-correlation described on the basis of FIG. 5. All other methods of calculating the cross-correlation between a measuring signal and a reaction signal may also be employed. Other methods of determining an impulse response instead of the cross-correlation may also be used.

At this point it is to be pointed out that the pseudonoise sequences used should be dimensioned depending on the impulse response to be expected of the considered channel regarding their length. For larger acoustic environments, impulse responses having the length of some few seconds are indeed possible. This fact has to be taken into account by selection of a corresponding length of the pseudonoise sequences for the correlation.

Depending on the circumstances, the inventive method of determining the impulse response or the inventive method of presenting an audio piece may be implemented in hardware or in software. The implementation may take place on a digital storage medium, in particular a floppy disc or CD with electronically readable control signals, which may interact with a programmable computer system so that the corresponding method is executed. In general, the invention thus also consists in a computer program product with a program code stored on a machine-readable carrier for the execution of the inventive method, when the computer program product is executed on a computer. In other words, the invention may thus be realized as a computer program with a program code for the execution of the method, when the computer program is executed on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An apparatus for determining an impulse response in an environment in which a speaker and a microphone are placed, using an audio signal, comprising:

a processor for spectrally coloring a test signal using a psychoacoustic masking threshold of the audio signal;

an introducer for introducing the colored test signal into the audio signal to obtain a measuring signal, which may be fed to the speaker; and a calculator for calculating the impulse response using a reaction signal received via the microphone from the environment and the test signal or the colored test signal, wherein the calculator is formed to perform a cross-correlation of the reaction signal received via the microphone from the environment and the test signal or the colored test signal, wherein the environment comprises several speakers and several microphones, wherein for a channel from a speaker to a microphone an impulse response is defined, wherein the apparatus further comprises:

a controller for controlling the introducer such that it introduces a colored test signal into audio signals for several speakers in order to generate a measuring signal of its own for each speaker, wherein the controller is further formed to base each measuring signal on a test signal of its own, wherein test signals are mutually orthogonal for various measuring signals; and wherein for each microphone a calculator of its own for cross-correlation is provided, which is used for cross-correlating the orthogonal test signals, and an identifier for identifying an obtained impulse response using the microphone with which the calculator for cross-correlating is associated by which the obtained impulse response is calculated, and using the speaker with which the corresponding test signal is associated, which is employed for obtaining the impulse response.

2. The apparatus of claim 1, wherein the test signal is a pseudonoise signal.

3. The apparatus of claim 1, wherein the processor for spectrally coloring is formed to color the test signal such that a spectral course of the colored test signal lies below the spectral psychoacoustic masking threshold of the audio signal so that the colored test signal is not audible in the measuring signal.

4. The apparatus of claim 1, wherein the environment comprises several speakers and several microphones, wherein for a channel from a speaker to a microphone an impulse response is defined, wherein the apparatus further comprises:

a controller for controlling the introducer such that it introduces a colored test signal into audio signals for the several speakers in order to generate a measuring signal of its own for each speaker, wherein the controller is further formed to sequentially apply measuring signals on the speakers; and an identifier for identifying an obtained impulse response regarding the speaker from which a generated measuring signal originates and regarding the microphone from which an associated reaction signal originates.

5. The apparatus of claim 1, wherein the calculator for calculating the impulse response is formed to postprocess a cross-correlation result using information on the processor for spectrally coloring in order to obtain an impulse response independent of the psychoacoustic masking threshold of the audio signal.

6. The apparatus of claim 1, wherein the calculator for calculating the impulse response is formed to obtain the cross-correlated iterative multiplication of the reaction signal and a conjugated complex transposed representation of the test signal, and summation of multiplication results in order to obtain an improved estimation of the impulse response with each iteration step.

7. The apparatus of claim 1, wherein the audio signal is an audio signal to be presented in the environment.

8. The apparatus of claim 1, wherein the audio signal is a music signal.

9. The apparatus of claim 1, wherein the speaker may be employed as microphone in an impulse response measuring mode.

10. An apparatus for presenting an audio piece in an environment in which several speakers and several microphones are placed, comprising:

a performer for performing a wave-field synthesis to calculate audio signals for the plurality of speakers on the basis of the audio piece; and a determinator for determining the impulse response in the environment in which a speaker and a microphone are placed, using an audio signal, comprising:

a processor for spectrally coloring a test signal using a psychoacoustic masking threshold of the audio signal;

an introducer for introducing the colored test signal into the audio signal to obtain a measuring signal, which may be fed to the speaker; and a calculator for calculating the impulse response using a reaction signal received via the microphone from the environment and the test signal or the colored test signal, wherein the determinator is formed to calculate a current impulse response during presenting the audio piece, wherein the performer for performing the wave-field synthesis is controllable to take a current impulse response into account in a calculation of the audio signal for the plurality of speakers during the presentation of the audio piece.

11. The apparatus of claim 10, wherein the environment when presenting the audio piece differs regarding its impulse response from the environment when no audio piece is presented.

12. The apparatus of claim 11, wherein a difference in the environment is that a number of people deviates from one situation to the next situation or that no people are in the environment.

13. The apparatus of claim 10, wherein the environment is a concert hall, a movie theater, or an audio presentation room at home.

14. The apparatus of claim 10, wherein the performer for performing the wave-field synthesis is formed to calculate positions of sound excitation sources and sound reflection sources due to an impulse response of the environment and takes them into account in the calculation of the audio signal for the plurality of speakers.

15. The apparatus of claim 10, wherein the microphones are placed remotely from the speakers or between the speakers.

16. The apparatus of claim 10, wherein the microphones are arranged in a circular, a linear, or a cross-shaped array.

17. The apparatus of claim 16, wherein the microphones are moved between individual cross-correlation calculations.

18. A method, performed by a hardware apparatus of determining an impulse response in an environment in which a speaker and a microphone are placed, using an audio signal, comprising:

spectrally coloring a test signal using a psychoacoustic masking threshold of the audio signal;

introducing the colored test signal into the audio signal to obtain a measuring signal, which can be fed to the speaker; and calculating the impulse response using a reaction signal received via the microphone from the environment and the test signal or the colored test signal, by performing a cross-correlation of the reaction signal received via the microphone from the environment and the test signal or the colored test signal, wherein the environment comprises several speakers and several microphones, wherein for a channel from a speaker to a microphone an impulse response is defined, wherein the method further comprises:

controlling the step of introducing such that a colored test signal is introduced into audio signals for several speakers in order to generate a measuring signal of its own for each speaker, wherein each measuring signal is based on a test signal of its own, wherein test signals are mutually orthogonal for various measuring signals; and wherein for each microphone an own step of calculating using a cross-correlation is provided, which is used for cross-correlating the orthogonal test signals, and identifying an obtained impulse response using the microphone with which an own step of calculating using a cross-correlation is associated by which the obtained impulse response is calculated, and using the speaker with which the corresponding test signal is associated, which is employed for obtaining the impulse response.

19. A method, performed by a hardware apparatus of presenting an audio piece in an environment in which several speakers and several microphones are placed, comprising:

performing a wave-field synthesis to calculate audio signals for the plurality of speakers on the basis of the audio piece; and determining the impulse response in the environment in which a speaker and a microphone are placed, using an audio signal, comprising:

spectrally coloring a test signal using a psychoacoustic masking threshold of the audio signal;

introducing the colored test signal into the audio signal to obtain a measuring signal, which may be fed to the speaker; and calculating the impulse response using a reaction signal received via the microphone from the environment and the test signal or the colored test signal, wherein a current impulse response is calculated while presenting the audio piece, wherein, in the step of performing the wave-field synthesis, a current impulse response is taken into account in a calculation of the audio signals for the plurality of speakers during the presentation of the audio piece.

20. A digital storage medium having stored thereon a computer program with a program code for performing, when the program is executed on a computer, the method of determining an impulse response in an environment in which a speaker and a microphone are placed, using an audio signal, comprising:

spectrally coloring a test signal using a psychoacoustic masking threshold of the audio signal;

introducing the colored test signal into the audio signal to obtain a measuring signal, which can be fed to the speaker; and calculating the impulse response using a reaction signal received via the microphone from the environment and the test signal or the colored test signal, by performing a cross-correlation of the reaction signal received via the microphone from the environment and the test signal or the colored test signal, wherein the environment comprises several speakers and several microphones, wherein for a channel from a speaker to a microphone an impulse response is defined, wherein the method further comprises:

controlling the step of introducing such that a colored test signal is introduced into audio signals for several speakers in order to generate a measuring signal of its own for each speaker, wherein each measuring signal is based on a test signal of its own, wherein test signals are mutually orthogonal for various measuring signals; and wherein for each microphone an own step of calculating using a cross-correlation is provided, which is used for cross-correlating the orthogonal test signals, and identifying an obtained impulse response using the microphone with which an own step of calculating using a cross-correlation is associated by which the obtained impulse response is calculated, and using the speaker with which the corresponding test signal is associated, which is employed for obtaining the impulse response.

21. A digital storage medium having stored thereon a computer program with a program code for performing, when the program is executed on a computer, the method of presenting an audio piece in an environment in which several speakers and several microphones are placed, comprising:

performing a wave-field synthesis to calculate audio signals for the plurality of speakers on the basis of the audio piece; and determining the impulse response in the environment in which a speaker and a microphone are placed, using an audio signal, comprising:

spectrally coloring a test signal using a psychoacoustic masking threshold of the audio signal;

introducing the colored test signal into the audio signal to obtain a measuring signal, which may be fed to the speaker; and calculating the impulse response using a reaction signal received via the microphone from the environment and the test signal or the colored test signal, wherein a current impulse response is calculated while presenting the audio piece, wherein, in the step of performing the wave-field synthesis, a current impulse response is taken into account in a calculation of the audio signals for the plurality of speakers during the presentation of the audio piece.

* * * * *